United States Patent

Takahashi et al.

[11] 3,944,755
[45] Mar. 16, 1976

[54] COMPOSITE FILTER CIRCUIT

[75] Inventors: Nobuaki Takahashi, Yamato; Masao Kasuga, Sagamihara; Yasuo Itoh, Tokyo, all of Japan

[73] Assignee: Victor Company of Japan, Ltd., Yokohama, Japan

[22] Filed: Feb. 18, 1975

[21] Appl. No.: 550,376

[30] Foreign Application Priority Data
Feb. 25, 1974  Japan.............................. 49-21356

[52] U.S. Cl.......... 179/100.4 ST; 179/1 GQ; 333/6; 333/70 R
[51] Int. Cl.² ........................ G11B 3/74; H03H 5/06
[58] Field of Search ............ 179/100.4 ST, 100.4 A, 179/1 G, 1 GQ; 333/70 R, 70 CR, 76, 6

[56] References Cited
UNITED STATES PATENTS

| | | | |
|---|---|---|---|
| 3,201,716 | 8/1965 | Giger | 333/70 R |
| 3,325,753 | 6/1967 | Shearer | 333/70 R |
| 3,358,246 | 12/1967 | Bensasson | 333/6 |
| 3,843,850 | 10/1974 | Takahashi | 179/100.4 ST |

*Primary Examiner*—Alfred H. Eddleman
*Assistant Examiner*—Jay. P. Lucas

[57] ABSTRACT

A composite filter circuit comprises a first series resonant circuit connected to a single common resistor, resonating at a first frequency, and exhibiting a low-pass filtering characteristic. A parallel resonant circuit includes one circuit element of the first series resonant circuit and resonates at a second frequency. A second series resonant circuit is connected to the single common resistor, resonating at the second frequency, and exhibiting a highpass filtering characteristic. The first series resonant circuit and the parallel resonant circuit constitute a low-pass filter circuit section. This low-pass filtering characteristic results from the total effects of the low-pass filtering characteristic of the first series resonant circuit, a dip characteristic of the parallel resonant circuit, and, in addition, a decreasing characteristic at the second frequency, due to the second series resonant circuit. The second series resonant circuit constitutes a high-pass or band-pass filter circuit section having a high-pass filtering characteristic resulting from the total effect of the high-pass filtering characteristic of the second series resonant circuit and, in addition, the decreasing characteristic at the first frequency due to the first series resonant circuit.

7 Claims, 12 Drawing Figures

COMPOSITE FILTER CIRCUIT

BACKGROUND OF THE INVENTION

This invention relates generally to a composite filter circuit and more particularly to a composite filter circuit which has a low-pass filtering characteristic and high-pass or band-pass filtering characteristic and which is suitable for use in a discrete multichannel disc reproducing apparatus.

A discrete four-channel record disc system is shown in United States as U.S. Pat. No. 3,686,471. A direct wave is comprised of the sum of a pair of two channels and an angle-modulated wave. The modulated wave is angle modulating a 30 KHz carrier wave responsive to the difference between a pair of two channels. These signals are superimposed and recorded on the side walls of the disc sound groove.

In picking up and reproducing a recorded signal from this multi-channel record, there is a need for taking out the angle-modulated difference signal from the picked up signal. This modulated signal is separated from the direct-wave sum signal and then demodulated. It is to be understood that the direct-wave sum signal has a frequency band ranging from 0 to 15 KHz, while the angle-modulated difference signal has a frequency band ranging from 20 KHz to 45 KHz.

In recording on a disc with a cutting stylus or in tracing a sound groove with a pick-up stylus, cutting or tracing distortion is generally inevitable. Because of these kinds of distortions, harmonics waves of the direct-signal are produced. The harmonic components are present in the vicinity of the frequency band of the angle-modulated wave.

In order to extract ideally only the angle-modulated signal component which contains no harmonic components of the direct-wave signal, the filtering characteristic of a high-pass filter (or band-pass filter) must be made sufficiently steep for passing the angle-modulated wave signal. On the other hand, a low-pass filter for deriving the direct wave signal, is also required to have a steep filtering characteristic so as not to pass the angle-modulated carrier wave.

However, simple filters having ideal filtering characteristics, satisfying the above described requirements, have not been available. Furthermore, since the above mentioned low-pass filter and high-pass filter were heretofore provided respectively as independent circuits, they required a large number of circuit elements.

SUMMARY OF THE INVENTION

Accordingly, it is a general object of the present invention to provide a novel and useful filter circuit in which the above described problems have been overcome.

A specific object of the invention is to provide a simple filter circuit having steep low-pass and high-pass, or band-pass filtering characteristics.

Another object of the invention is to provide a filter circuit having low-pass and high-pass filtering characteristics due to mutual interference of one part of a low-pass filter circuit and one part of a high-pass filter circuit.

Still another object of the invention is to provide, in a multichannel record disc reproducing apparatus, a filter circuit for respectively separating and deriving a direct-wave signal and an angle-modulated difference signal from a multiplex signal reproduced from the pickup.

Further objects and features of the invention will be apparent from the following detailed description when read in conjunction with the accompanying drawings.

DETAILED DESCRIPTION

Figure 1:
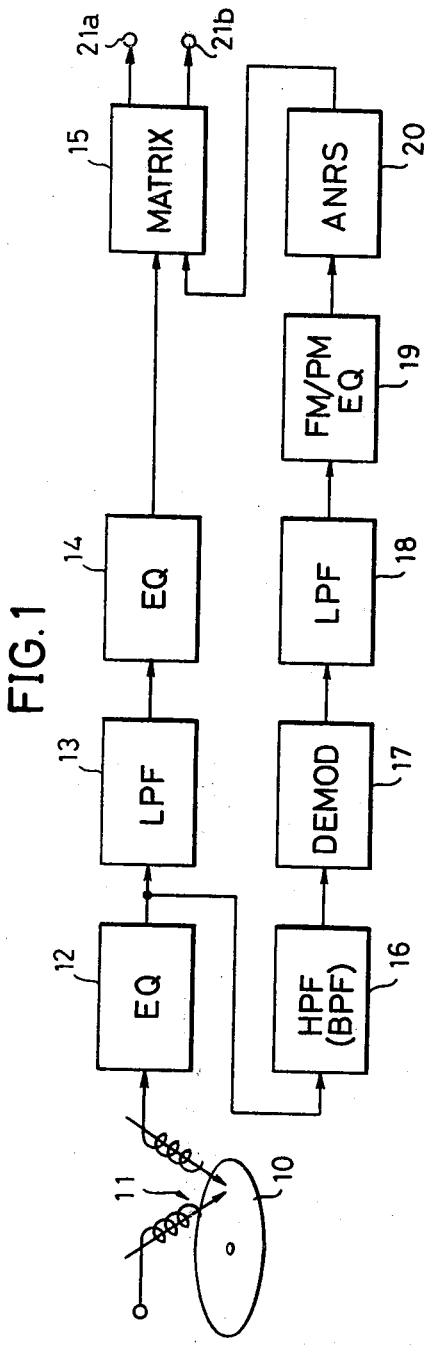
FIG. 1 is a block diagram showing one example of a discrete multichannel disc reproducing system, of a general type, in which the filter circuit of the invention can be applied.

FIG. 1 shows one example of a discrete 4-channel disc reproducing system in which the filter circuit of the invention can be applied.

A multiplexed signal of a direct wave sum signal and an angle-modulated difference signal for each pair of channels (first and second channels, third and fourth channels) is recorded on each side wall of the sound groove of a four-channel record disc 10. Hence, the signals for a total of four channels are so recorded. A multiplexed signal comprising the direct wave sum signal and the angle-modulated wave difference signal for the two-channel signal is picked up from the left wall of the grooves of the disc 10, by a pickup cartridge 11. The picked up signal is fed to an equalizer 12 with a RIAA (Recording Industries Association of America) turnover characteristic, for equalization.

The resulted signal is fed to a low-pass filter 13 for elimination of the angle-modulated wave component and for deriving the direct wave sum signal component only. The direct wave sum signal is fed to a matrix circuit 15, via an equalizer 14 having the RIAA roll-off characteristic.

The output of the equalizer 12 is partly fed to a high-pass filter 16 (or band-pass filter) having a pass-band in the approximate range of more than 20 KHz. An angle-modulated wave difference signal is derived from this filter. The angle-modulated wave difference signal is fed to a demodulation circuit 17 of a phase locked loop (PLL) containing a phase comparator, a loop gain control circuit and a voltage-controlled oscillator, etc. The demodulated output from circuit 17 is supplied to a low-pass filter 18, and the unwanted components contained in the output are eliminated. The output from the low-pass filter 18 is fed to the matrix circuit 15 via (in succession) an FM/PM equalizer 19 and an automatic noise reduction system (ANRS) circuit 20, comprising an expandor having a characteristic which compensates for the characteristic of a compressor used in the recording system.

In the matrix circuit 15, the direct wave sum signal from the equalizer 14 and the demodulated difference signal from the ANRS circuit 20 are matrixed. From output terminals 21a and 21b are derived, for instance, the left front (the first channel) and the left rear (the second channel) signals, respectively.

FIG. 1 shows only the circuit for the first and second channel signals (the left channel system for the grooves of the disc 10). However, exactly the same circuit is provided for the right front (the third) and the right rear (the fourth) channel. Detailed illustration and description of this right system are omitted herein.

Heretofore, for the above described low-pass filter 13 and high-pass filter 16, a low-pass filter and high-pass filter of, respectively, independent circuits were used. In accordance with the present invention, a single composite filter circuit has a low-pass filter circuit and a high-pass filter circuit, as described below. It can be used instead of the discrete low-pass filter 13 and high-pass filter 16.

Figure 2:
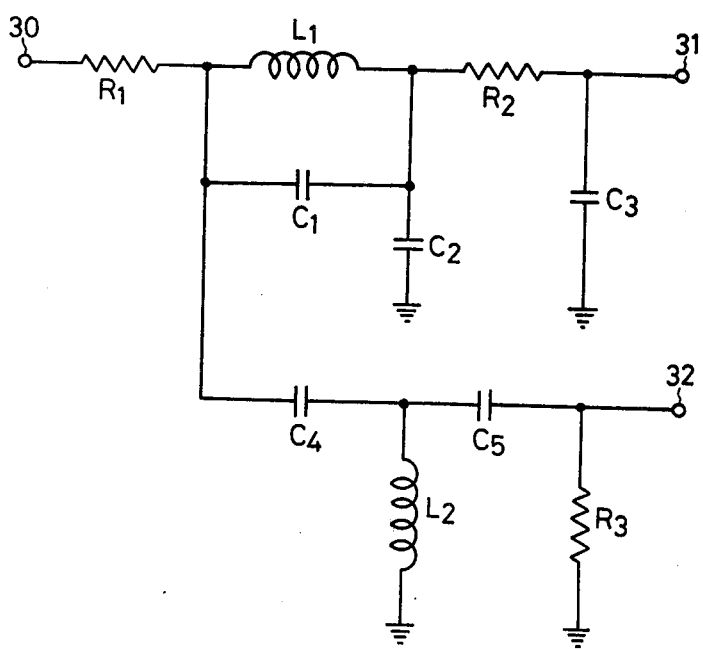
FIG. 2 is a circuit diagram of one embodiment of the composite filter circuit according to the invention.

One embodiment of the inventive composite filter comprises a low-pass filter circuit and high-pass filter circuit (FIG. 2). A signal from the equalizer 12 is applied to an input terminal 30. A resistor R1 is commonly used in both a low-pass filter circuit and a high-pass filter circuit, as described below. A parallel resonant circuit of a coil L1 and a capacitor C1 is connected to the resistor R1. Between the output side of this parallel resonant circuit and ground (earth), there is connected a capacitor C2. The resonant frequency of the parallel circuit is at approximately 30 KHz, which is equal to the carrier wave frequency of the angle-modulated difference signal. A resistor R2 is connected between the output side of the above mentioned parallel resonant circuit and an output terminal 31. A capacitor C3 is connected between ground and the junction between the resistor R2 and the output terminal 31. The above described components, between the input terminal 30 and the output terminal 31, form the low-pass filter circuit.

Figure 3:
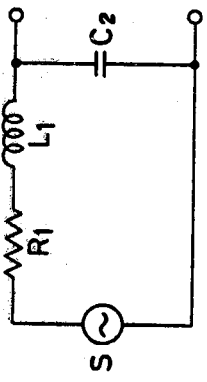
FIG. 3 is an equivalent circuit diagram showing one part of a low-pass filter circuit, in the circuit shown in FIG. 2.
Figure 4:
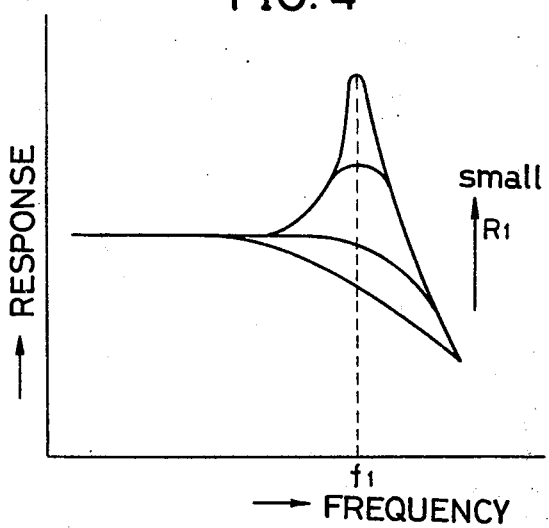
FIG. 4 is a graph indicating the frequency-response characteristic of the circuit illustrated in FIG. 3.
Figure 5A:
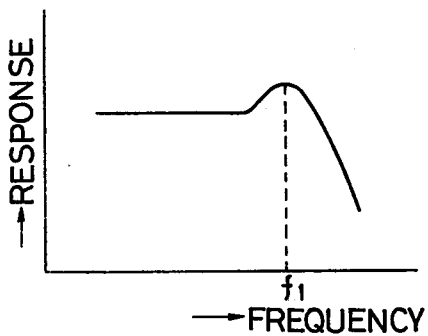
FIGS. 5A, 5B and 5C are graphs respectively indicating frequency-response characteristics of certain parts of the low-pass filter circuit shown in FIG. 2.

In this circuit, the resistor R1, coil L1, and capacitor C2 constitute a series resonant circuit as indicated by equivalent circuit in FIG. 3. This series resonant circuit has a series resonance and is operated by a signal from a signal source S, corresponding to the signal supplied to the input terminal 30. The frequency-response characteristic of this circuit becomes as indicated in FIG. 4. In this circuit, the resistance of the resistor R1 may be any one of many selected values while the inductance of the coil L1 and the capacitance of the capacitor C2 are respectively kept constant. The value of the quality factor Q of resonance, changes with the resistance value. That is, as the resistance of the resistor R1 is decreased, the Q value of the resonant circuit will increase, and the response at the resonant frequency $f_1$ will also increase to a high peak. The slopes of the filter characteristics in front of and behind this peak become steep. Accordingly, by appropriately selecting the resistance value of the resistor R1, the magnitude of the peak at the frequency $f_1$ can be suitably selected, as indicated in FIG. 5A.

Here, the frequency $f_1$ is selected at approximately 15 KHz, which is equal to the upper limit frequency of the band of the direct-wave sum signal.

Figure 5B:
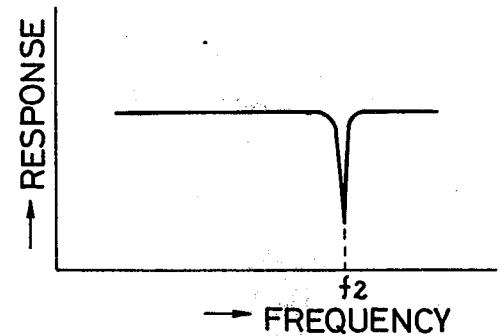

The parallel resonant circuit comprising the coil L1 and the capacitor C1 exhibits a frequency-response characteristics as indicated in FIG. 5B. This frequency-response characteristic has an abrupt dip at the resonant frequency $f_2$ (approximately 30 KHz).

Figure 5C:
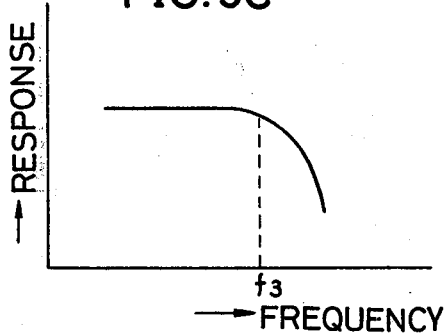

Furthermore, the low-pass filter circuit section comprising the resistor R2 and the capacitor C3 has the frequency-response characteristic indicated in FIG. 5C. The cut-off frequency $f_3$ of this circuit section is selected at approximately 10 KHz.

Figure 9:
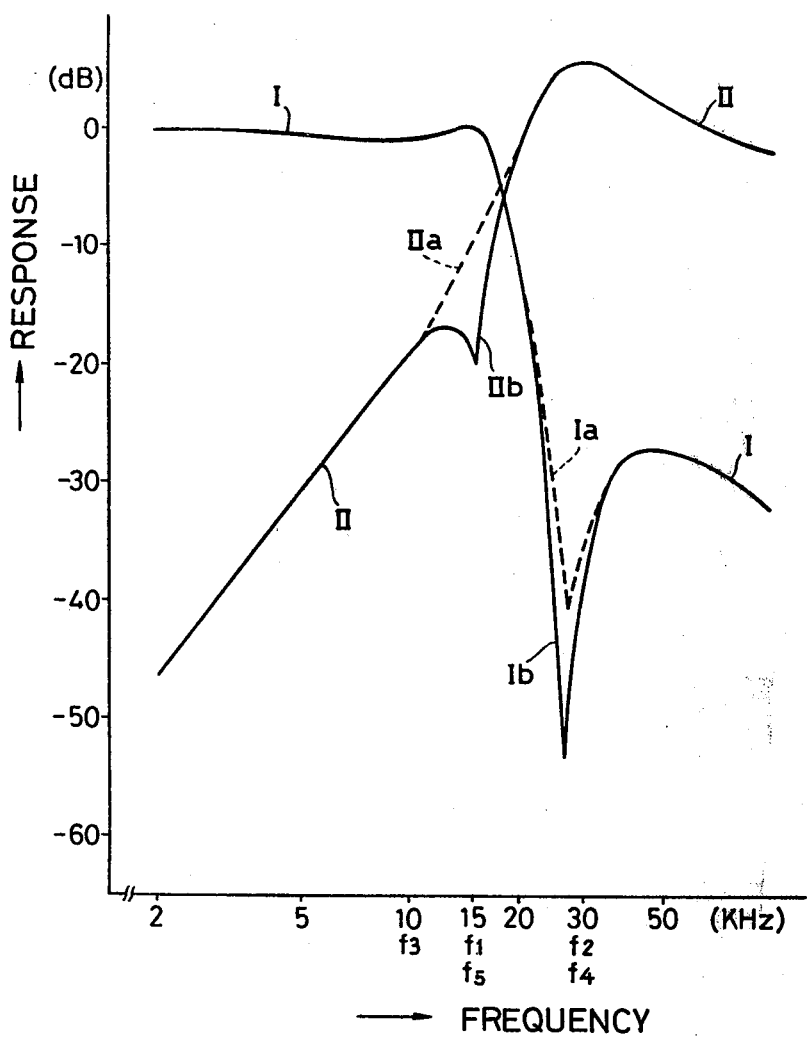
FIG. 9 is a graph indicating total frequency-response characteristics (filtering characteristics) of the filter circuit illustrated in FIG. 2.

Accordingly, the above described low-pass filter circuit section, per se, exhibits a frequency-response characteristic, as indicated by the curve I-Ia-I in FIG. 9 which are a combination of the characteristic curves shown in FIGS. 5A, 5B and 5C. More specifically, in this characteristic, there is a substantially flat frequency band extending from zero to approximately 15 KHz, as indicated by the curve I. At frequencies exceeding 15 KHz, there is a steep decrease which results in a dip in the neighborhood of 30 KHz, as indicated by curve Ia. At frequencies higher than 30 KHz, the response characteristic rises somewhat from the dip, but, even then, there is practically no signal filtration since the decrease is great.

In the circuit of the present invention, the curve Ia shown by a dashed line actually becomes more like the curve Ib, which is shown by full line, because of the high-pass filter circuit.

Next, the high-pass filter circuit is shown in FIG. 2. One side of a capacitor C4 is connected in series to the common resistor R1. A coil L2 is connected between the other side of the capacitor C4 and ground. A capacitor C5 is connected from the junction between the capacitor C4 and the coil L2 to an output terminal 32, and a resistor R3 is connected between ground and the junction between the capacitor C5 and the output terminal 32.

Figure 6:
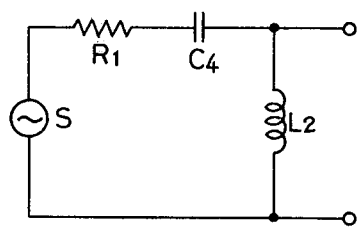
FIG. 6 is an equivalent circuit diagram of one part of a high-pass filter circuit shown in FIG. 2.
Figure 7:
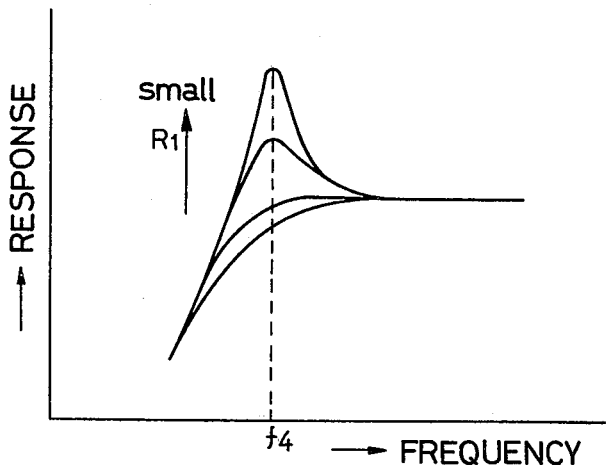
FIG. 7 is a graph indicating the frequency-response characteristic of the circuit illustrated in FIG. 6.

The resistor R1, the capacitor C4, and the coil L2 constitute a series resonant circuit, as indicated by the equivalent circuit in FIG. 6. This series resonant circuit is resonant when energized by a signal from a signal source S corresponding to the signal applied to the input terminal 30. The frequency-response characteristic becomes as indicated in FIG. 7. If, in this circuit, the resistance of the resistor R1 is selected at various values while the capacitance of the capacitor C4 and the inductance of the coil L2 are kept constant, the Q value of resonance will change. That is, as the resistance of the resistor R1 is made smaller, the Q value of the resonant circuit will increase. The response at the resonant frequency $f_4$ will increase to a high peak, and the slopes of the characteristic curve before and behind this peak become steep. Accordingly, by appropriately selecting the resistance value of the resistor R1, the magnitude of the peak at the frequency $f_4$ can be suitably selected, as indicated in FIG. 8A.

Figure 8A:
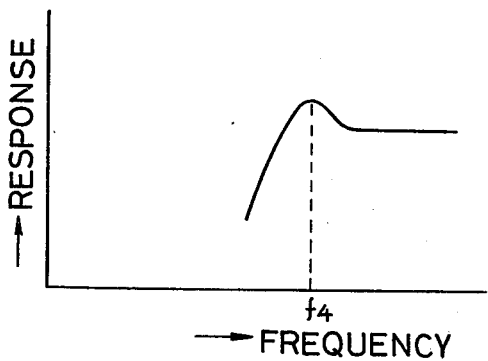
FIGS. 8A and 8B are graphs respectively indicating the frequency-response characteristics at certain parts of the high-pass filter circuit shown in FIG. 2.

Since the resistor R1 is used commonly in the low-pass filter circuit, the characteristics of the two resonant circuits have peaks as indicated in FIGS. 5A and 8A.

The resonant frequency $f_4$ is approximately 30 KHz similar to the aforementioned frequency $f_2$.

Figure 8B:
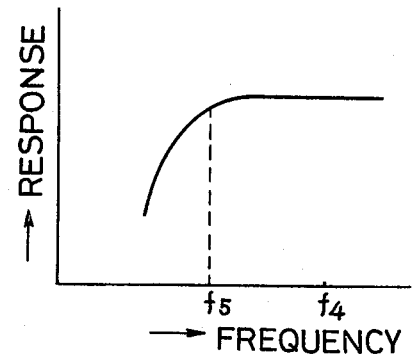

Furthermore, the capacitor C5 and the resistor R3 constitute a high-pass filter circuit having a frequency-response characteristic as indicated in FIG. 8B. In this case, the cut-off frequency $f_5$ is selected at approximately 15 KHz, similar to the aforementioned frequency $f_1$.

Accordingly, the above described high-pass filter circuit section, per se, exhibits a frequency-response characteristic as indicated by the curve II—IIa—II in FIG. 9, which is a combination of the characteristics indicated in FIGS. 8A and 8B. More specifically, in this characteristic, there is a peak at the frequency 30 KHz. At lower frequencies, particularly in the band below 20 KHz, there is a great decrease. At frequencies higher than 30 KHz, a high-pass (or band-pass) filtering gently decreasing characteristic is indicated. As a result of the low-pass filter circuit, the curve IIa shown by a dashed line actually becomes more like the curve IIb shown by a full line.

In the circuit arrangement shown in FIG. 2, the low-pass filter circuit and the high-pass filter circuit are connected in parallel, with the resistor R1 used commonly. Accordingly, a low-pass filter circuit and a series resonant circuit (FIG. 6) having a resonant frequency of 30 KHz, are connected in parallel. For this reason, input signals of 30 KHz and frequencies in the neighborhood thereof, pass through the capacitor C4 of the series resonant circuit of the high-pass filter circuit, which exhibits a low impedance at this frequency.

As a consequence, signals of 30 KHz, and frequencies in the neighborhood thereof, pass through the low-pass filter circuit with a great decrease as indicated by characteristic curve Ia in FIG. 9, responsive to the parallel resonant circuit of the coil L1 and the capacitor C1. In addition, the series resonant circuit comprising the capacitor C4 and the coil L2 of the high-pass filter circuit, cause a further great decrease. For this reason, of the combined characteristic of the low-pass filter circuit, the characteristic with respect to 30 KHz and frequencies in the neighborhood thereof, becomes as indicated by curve Ib, and the overall characteristic becomes as indicated by the curve I-Ib-I.

Therefore, in addition to the great decrease of the component of 30 KHz and frequencies in the neighborhood thereof, the decreasing characteristic of frequencies above 20 KHz becomes even steeper.

For this reason, the circuit of the present invention, uses both the low-pass and the high-pass filtering characteristic inherent in the low-pass and high-pass filter circuit sections. Hence, the effect of the high-pass filter circuit section is effectively utilized to produce an even more desirable low-pass filtering characteristic. As a result, only a direct-wave signal component from which the angle-modulated wave has been positively removed is derived from the output terminal 31 and is fed to the equalizer 14.

On the other hand, a series resonant circuit comprising the coil L1 and capacitor C2, and having a resonant frequency of 15 KHz, is connected in parallel with the high-pass filter circuit section. For this reason, the currents of a signals of 15 KHz, and frequencies in the neighborhood thereof, in the input signal flow almost entirely to the above mentioned series resonant circuit of the low-pass filter circuit section, thus exhibiting low impedance at these frequencies.

Consequently, of the signal passing through the high-pass filter circuit section, signals of 15 KHz and frequencies in the neighborhood thereof acquire a frequency-response characteristic as indicated by curve IIb in FIG. 9. There is a decrease of approximately 10 dB, for example, from the characteristic indicated by curve IIa as a result of the series resonant circuit of the low-pass filter circuit section. The overall characteristic is indicated by curve II-IIb-II.

Therefore, in addition to the great decrease of the component of 15 KHz, and the frequencies in the neighborhood thereof, the decreasing characteristic becomes even steeper, particularly at frequencies below 20 KHz.

For this reason, in the composite filtering circuit of the present invention, not only the high-pass filtering characteristic inherent in the high-pass filter circuit section but also the effect of the low-pass filter circuit section is effectively utilized. Hence an even more desirable high-pass filtering characteristic is obtained. From the output terminal 32, only an angle-modulated wave component, from which the direct-wave signal component and higher harmonic components thereof have been positively removed, is derived and fed to the demodulation circuit 17.

One example of the constants of the various circuit elements in the circuit illustrated in FIG. 2 is as follows:
Resistors — R1 560 Ω, R2 10 kΩ, R3 10 kΩ
Capacitors — C1 0.0033 μF, C2 0.0068 μF, C3 0.0033 μF, C4 0.0027 μF, C5 0.001 μF
Coils — L1 10 MH, L2 10 MH In actual circuit, a limiting amplifier is connected between the high-pass filter circuit section and the demodulation circuit 17. If this limiting amplifier is of the positive input type, the output terminal 32 of the high-pass filter circuit section may be as shown in the circuit of FIG. 2. If this limiting amplifier is of the negative input type, however, one terminal of the resistor R3 is not grounded, but becomes an output terminal and is connected to the input of the limiting amplifier of negative input type.

Further, this invention is not limited to these embodiments but various variations and modifications may be made without departing from the scope and spirit of the invention.

What is claimed is:

1. A composite filter circuit comprising: a resistor having one end to which an input signal is applied; a first series resonant circuit connected to the other end of said resistor, said first series circuit resonating with a first frequency and exhibiting a low-pass filter characteristic; a parallel resonant circuit having a common circuit element which is a constituent part of said first series resonant circuit, said parallel circuit resonating with a second frequency which is higher than said first frequency and exhibiting a frequency-response dip at said second frequency; and a second series resonant circuit connected to said other end of said resistor and in parallel with said first series resonant circuit and parallel resonant circuit, said second series circuit resonating with a frequency which is substantially equal to said second frequency and exhibiting a high-pass or band-pass filtering characteristic, said first series resonant circuit and parallel resonant circuit constituting a low-pass filter circuit for filtering signals of a first specified frequency band, said second series resonant circuit constituting a high-pass or band-pass filter circuit for filtering signals of a second specified frequency band, said low-pass filter circuit section producing an output signal filtered with a low-pass filtering characteristic responsive to the low-pass filtering characteristic of said first series resonant circuit, said filtered output signal having a dip characteristic at said second frequency and frequencies in the neighborhood thereof, and a decreasing characteristic at said second frequency and frequencies in the neighborhood thereof, said high-pass filter circuit producing an output signal filtered with a high-pass or band-pass filtering characteristic responsive to a total of the high-pass or band-pass filtering characteristic of said second series resonant circuit and a decreasing characteristic at said first frequency and frequencies in the neighborhood thereof.

2. A composite filter circuit as claimed in claim 1 in which said low-pass filter circuit further has a low-pass filter circuit exhibiting a low-pass filtering characteristic wherein the cut-off frequency is a third frequency which is lower than said first frequency and, as a total characteristic, exhibits a generally flat characteristic in the frequency band which is lower than said first frequency, and said high-pass filter circuit further has a high-pass filter circuit exhibiting a high-pass filtering characteristic wherein the cut-off frequency is a fourth frequency which is lower than said second frequency.

3. A composite filter circuit as claimed in claim 2 and means for picking up and reproducing from a multichannel record disc a multiplexed signal recorded thereon, said recorded signal comprising a direct-wave sum signal having a band of approximately 0 to 15 KHz and an angle-modulated wave difference signal in a band of approximately 20 KHz to 45 KHz which is obtained by angle modulating a carrier wave of 30 KHz with a difference signal, and in which said first and second frequencies are approximately 15 KHz to 30 KHz, respectively; said low-pass filter circuit has a total frequency-response characteristic having a generally flat characteristic in a band of approximately 0 to 15 KHz, a great dip at approximately 30 KHz, and a greatly decreasing characteristic in a band of substantially 15 KHz to 30 KHz; and said high-pass filter circuit has a total frequency-response characteristic having a dip at about 15 KHz and a greatly decreasing characteristic at frequencies below 20 KHz and filtering the band above 20 KHz.

4. A composite filter circuit as claimed in claim 3 in which said third frequency is approximately 10 KHz, and said fourth frequency is selected at approximately 15 KHz.

5. A composite filter circuit as claimed in claim 1 and means for picking up and reproducing from a record disc a multiplexed signal recorded thereon, said recorded signal comprising a direct-wave signal in a band substantially equal to said first frequency and an angle-modulated wave signal which is obtained by angle modulating a carrier wave of a frequency equal to said second frequency, and in which said low-pass filter circuit filters said direct-wave signal while said high-pass filter circuit filters said angle-modulated wave signal.

6. A composite filter circuit comprising:
a first resistor to one end of which an input signal is applied;
a first series resonant circuit comprising a first coil connected between the other end of said first resistor and a first capacitor, said first resonant circuit resonating with a first frequency, and exhibiting a low-pass filtering characteristic;
a second capacitor connected in parallel with said first coil and constituting in conjunction with said first coil a parallel resonant circuit resonating with a second frequency;
a low-pass filter circuit comprising a second resistor connected between said first series resonant circuit and a third capacitor, said low-pass filter circuit having a cut-off frequency equal to a third frequency;
a second series resonant circuit comprising a fourth capacitor connected to the other end of said first resistor and a second coil, said second resonant circuit resonating with the second frequency, and exhibiting a high-pass or band-pass filtering characteristic; and
a high-pass or band-pass filter circuit comprising a fifth capacitor connected to said second series resonant circuit and a third resistor, said high-pass or band-pass filter having a cut-off frequency equal to the first frequency,
said first series resonant circuit, parallel resonant circuit, and low-pass filter circuit constituting a low-pass filter circuit section for filtering signals of a first specified frequency band,
said second series resonant circuit and high-pass or band-pass filter circuit constituting a high-pass or band-pass filter circuit section for filtering signals of a second specified frequency band,
said low-pass filter circuit section exhibiting a low-pass filtering characteristic which is generally flat from zero frequency to said first frequency, decreases steeply at frequencies above said first frequency, and has a great dip at said second frequency, said low-pass filtering characteristic resulting from combined effects of the low-pass filter characteristic having a peak at the first frequency of said first series resonant circuit, a dip characteristic at said second frequency of said parallel resonant circuit, a decreasing characteristic at said second frequency due to the existence of said second series resonant circuit, and a low-pass filtering characteristic wherein the cut-off frequency of said low-pass filter circuit is the third frequency,
said high-pass filter circuit section exhibiting a high-pass or band-pass filtering characteristic having a dip at said first frequency and a peak at said second frequency resulting from a total of the high-pass filter characteristic having a peak at the second frequency of said second series resonant circuit, the high-pass or band-pass filtering characteristic wherein the cut-off frequency of said high-pass or band-pass filter circuit is the first frequency, and the decreasing characteristic at the first frequency due to the existence of said first series resonant circuit.

7. A composite filter circuit as claimed in claim 6 and means for picking up and reproducing from a multichannel record disc a multiplexed signal recorded thereon of a direct-wave sum signal of a band of approximately 0 to 15 KHz and an angle-modulated wave difference signal of a band of approximately 20 KHz to 45 KHz obtained by angle modulating a carrier wave of 30 KHz responsive to a difference signal, and in which said first, second, and third frequencies are approximately 15 KHz, 30 KHz, and 10 KHz, respectively.

* * * * *